United States Patent [19]

Miner

[11] Patent Number: 4,939,454
[45] Date of Patent: Jul. 3, 1990

[54] CONNECTOR SYSTEM FOR PRINTED CIRCUIT BOARD TEST FACILITY

[75] Inventor: William R. Miner, Loveland, Colo.

[73] Assignee: Hewlett-Packard Company, Palo Alto, Calif.

[21] Appl. No.: 393,067

[22] Filed: Aug. 7, 1989

Related U.S. Application Data

[63] Continuation of Ser. No. 224,091, Jul. 26, 1988, abandoned.

[51] Int. Cl.$^5$ .......................... G01R 31/02; G01R 1/06
[52] U.S. Cl. .............................. 324/158 F; 324/158 P
[58] Field of Search ........... 324/158 F, 158 P, 73 PC, 324/72.5

[56] References Cited

U.S. PATENT DOCUMENTS

| | | | |
|---|---|---|---|
| 4,340,858 | 7/1982 | Malloy | 324/158 F |
| 4,417,204 | 11/1983 | Dehmel et al. | 324/158 F |
| 4,465,972 | 8/1984 | Sokolich | 324/73 PC |
| 4,724,377 | 2/1988 | Maelzer et al. | 324/158 F |

OTHER PUBLICATIONS

Part No. 168249; Virginia Panel Corp., Waynesbourgh VA; 7-1987.

*Primary Examiner*—Ernest F. Karlsen

[57] ABSTRACT

The connector system for a printed circuit board test facility provides an efficient and unitary electrical and mechanical interconnection between the scanner pins of the bed of nails and the device scanner elecronics printed circuit cards that comprise the printed circuit board test facility. The connector system consists of a plurality of connector blocks oriented in a side by side arrangement to implement the xy coordinate axis matrix of scanner pins of the bed of nails. Each connector block consists of a custom molded plastic block that is equipped with replaceable spring loaded scanner pins. The connector block offers very high stiffness to minimize deflection under load of the spring loaded pins, very accurate dimensional stability, high impedance to electrical signals, a thermal expansion characteristic similar to the probe plate to which it is attached and very accurate positioning. Each scanner pin is connected t a lead wire that is bent in the shape of a question mark. Each lead wire passes through a corresponding plated hole in the device scanner electronics printed circuit card of the printed circuit board test facility and is soldered in place. The bend in the lead wires minimizes mechanical resistance to relative motion and also minimizes stress on the soldered connection and scanner pin caused by such motion. This connector system configuration provides a number of important characteristics: short electrical path from the scanner pins to the electronics on the device scanner electronics printed circuit cards; very accurate three axis location of each scanner pin with respect to a single fixed point in space; significant single axis compliance between the scanner pin and the device scanner electronics printed circuit cards to allow for scanner pin positioning when the device scanner electronics printed circuit card is fixed in that axis.

32 Claims, 2 Drawing Sheets

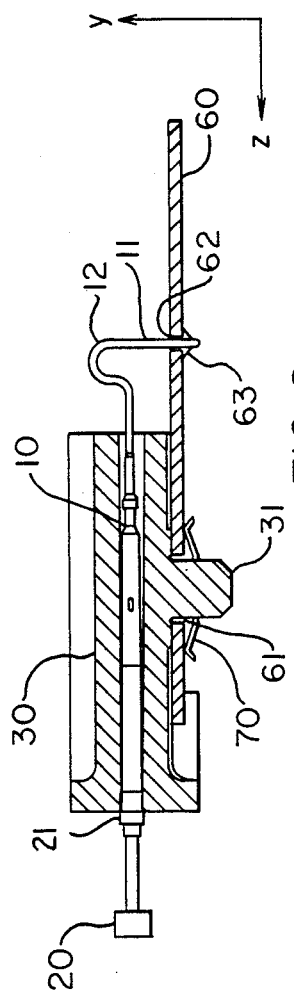
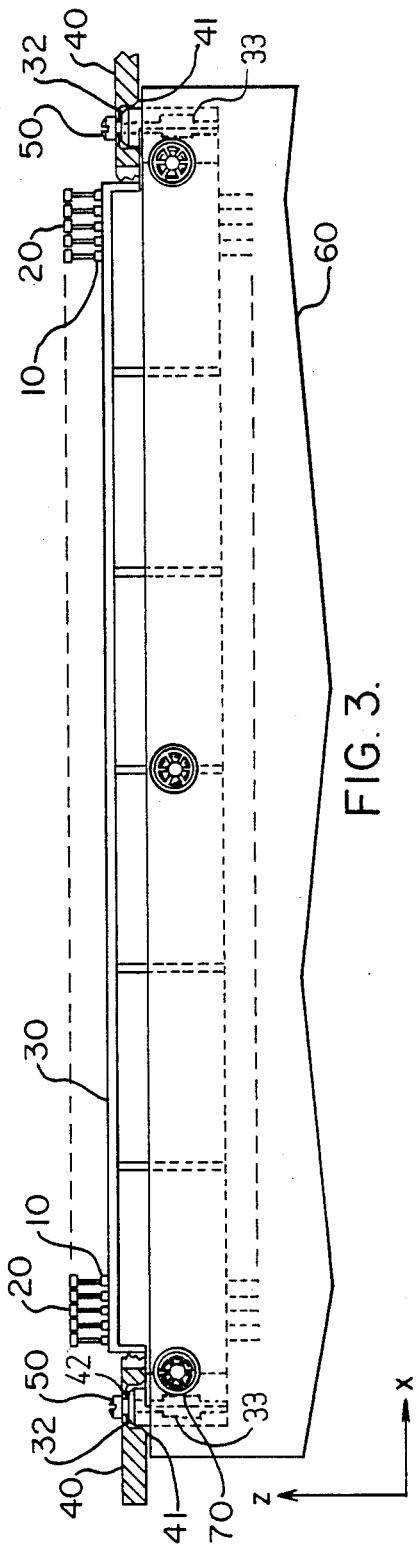

CONNECTOR SYSTEM FOR PRINTED CIRCUIT BOARD TEST FACILITY

CROSS REFERENCE TO RELATED APPLICATION

This application is a continuation of application Ser. No. 224,091, filed July 26, 1988, now abandoned.

RELATED APPLICATION

This application is related to the following filed application by inventors Stephen J. Cook and Michael L. Bullock:

Bendable Pin Board Test Fixture, S.N. 794,198, filed Nov. 1, 1985, now U.S. Pat. No. 4,799,007.

FIELD OF THE INVENTION

This invention relates to printed circuit board test facilities and, in particular, to a connector system that is used to interconnect the bed of nails interface to the printed-circuit-board-under-test with the test circuitry of the printed circuit board test facility.

PROBLEM

It is a problem in the field of printed circuit board test facilities to efficiently interconnect the bed of nails interface to the printed-circuit-board-under-test fixture with the device scanner electronics printed circuit cards that comprise the electronic circuitry of the printed circuit board test facility. A printed circuit board test facility is a completely integrated set of resources that is used for testing analog, hybrid and digital circuits. The printed circuit board test facility typically performs shorts and open tests; analog, hybrid and digital in-circuit tests; and analog, hybrid and digital cluster and functional tests on the devices that are mounted on a printed circuit board. The test sequences executed by the printed circuit board test facility are programmed into the printed circuit board test facility by a test engineer to match the operational requirements of the printed-circuit-board-under-test. The test engineer writes a test program that causes the printed circuit board test facility to generate a sequence of stimuli in a timed relationship and apply these stimuli to the printed-circuit-board-under-test. Electrical interconnection to the printed-circuit-board-under-test is accomplished through a "bed of nails" interface that consists of a plurality of electrically conductive scanner pins in a prearranged pattern on the printed circuit board test facility. The printed-circuit-board-under-test is placed on top of this "bed of nails" and secured in place so that the printed circuit board test facility can apply the stimuli electrical signals to various devices and conductive paths on the printed-circuit-board-under-test. The printed circuit board test facility also monitors predesignated points on the printed-circuit-board-under-test via the scanner pins to detect responses to the stimuli applied to the printed-circuit-board-under-test. The timing and pattern of output signals generated by the printed-circuit-board-under-test in response to the programmed stimuli are compared with a set of known printed circuit board responses to determine whether the printed-circuit-board-under-test is operational. In the printed circuit board test facility, a printed circuit board connector system is used to provide both a mechanical and an electrical interface between the "bed of nails" scanner pins and the device scanner electronics printed circuit cards that contain the circuitry of the printed circuit board test facility. The stimuli electrical signals applied by the printed circuit board test facility to the printed-circuit-board-under-test and responses thereto pass through the printed circuit board connector system both on their way to and from the electronic components on the printed-circuit-board-under-test. Therefore, the printed circuit board connector system must maintain the signal quality of the stimuli and response electrical signals to insure that the electronic components on the printed-circuit-board-under-test are not incorrectly designated as operating properly or improperly. The length of the signal path between the scanner pins and the device scanner electronics printed circuit cards of the printed circuit board test facility must be kept as short as possible to insure signal quality. This normally dictates a vertical configuration of the device scanner electronics printed circuit cards of the printed circuit board test facility on top of which is placed the bed of nails scanner pins. The printed-circuit-board-under-test rests directly on the bed of nails scanner pins. The difficulty with this architecture of the printed circuit board test facility is that it is extremely difficult to assemble and maintain this system. The scanner pins from the bed of nails are typically secured in place by the use of a large rectangular probe plate into which are drilled a matrix or xy coordinate system of holes, each of which accepts a scanner pin assembly. A typical method of interconnecting the scanner pin assembly uses a wire wrap terminal connected to each of the scanner pins of the "bed of nails" to enable interconnection of the bed of nails to the device scanner electronics printed circuit cards of the printed circuit board test facility. A conductor from a connectorized cable is electrically connected to each wire wrap terminal connected to a scanner pin of the bed of nails to provide an electrical interface. A mating connector is wired to each of the device scanner electronics printed circuit cards in the printed circuit board test facility to enable the electrical interconnection of these device scanner electronics printed circuit cards and the bed of nails scanner pins. The difficulty with this arrangement is that there are a number of electrical interconnections, each of which adds a resistance of variable magnitude to the electrical connection between the scanner pins and the electronic components on the device scanner electronics printed circuit cards of the printed circuit board test facility. The length of the electrical path therefore introduces a significant amount of resistance, adversely affecting the electrical performance of the printed circuit board test facility.

SOLUTION

The above described problems are solved and a technical advance achieved in the field by the connector system for a printed circuit board test facility that provides an efficient and unitary electrical and mechanical interconnection between the scanner pins of the bed of nails and the device scanner electronics printed circuit cards that comprise the printed circuit board test facility. The connector system consists of a plurality of connector blocks oriented in a side by side arrangement to implement the xy coordinate axis matrix of scanner pins of the bed of nails. Each connector block consists of a custom molded plastic block that is equipped with replaceable spring loaded scanner pins. The connector block offers very high stiffness to minimize deflection under load of the spring loaded pins, very accurate dimensional stability, high impedance to electrical signals, a thermal expansion characteristic similar to the receiving plate to which it is attached, and very accurate positioning. Each scanner pin is connected to a lead wire that is bent in a curved shape, for example, in the shape of a question mark. Each lead wire passes through a corresponding plated hole in the device scanner electronics printed circuit card of the printed circuit board test facility and is soldered in place. The bend in the lead wires minimizes mechanical resistance to relative motion and also minimizes stress on the soldered connection and scanner pin caused by such motion. This connector system configuration provides a number of important characteristics: short electrical path from the scanner pins to the electronics on the device scanner electronics printed circuit cards; very accurate three axis location of each scanner pin with respect to a single fixed point in space; and significant single axis compliance between the scanner pin and the device scanner electronics printed circuit cards to allow for scanner pin positioning when the device scanner electronics printed circuit card is fixed in that axis. These and other features and advantages of the invention can be ascertained by a reading of the following detailed description.

BRIEF DESCRIPTION OF THE DRAWING

FIG. 2 illustrates a cross sectional view of the connector block and one of the scanner pins; and FIG. 3 illustrates a side elevational view of the connector block of FIG. 1.

DETAILED DESCRIPTION OF THE DRAWING

Figure 1:
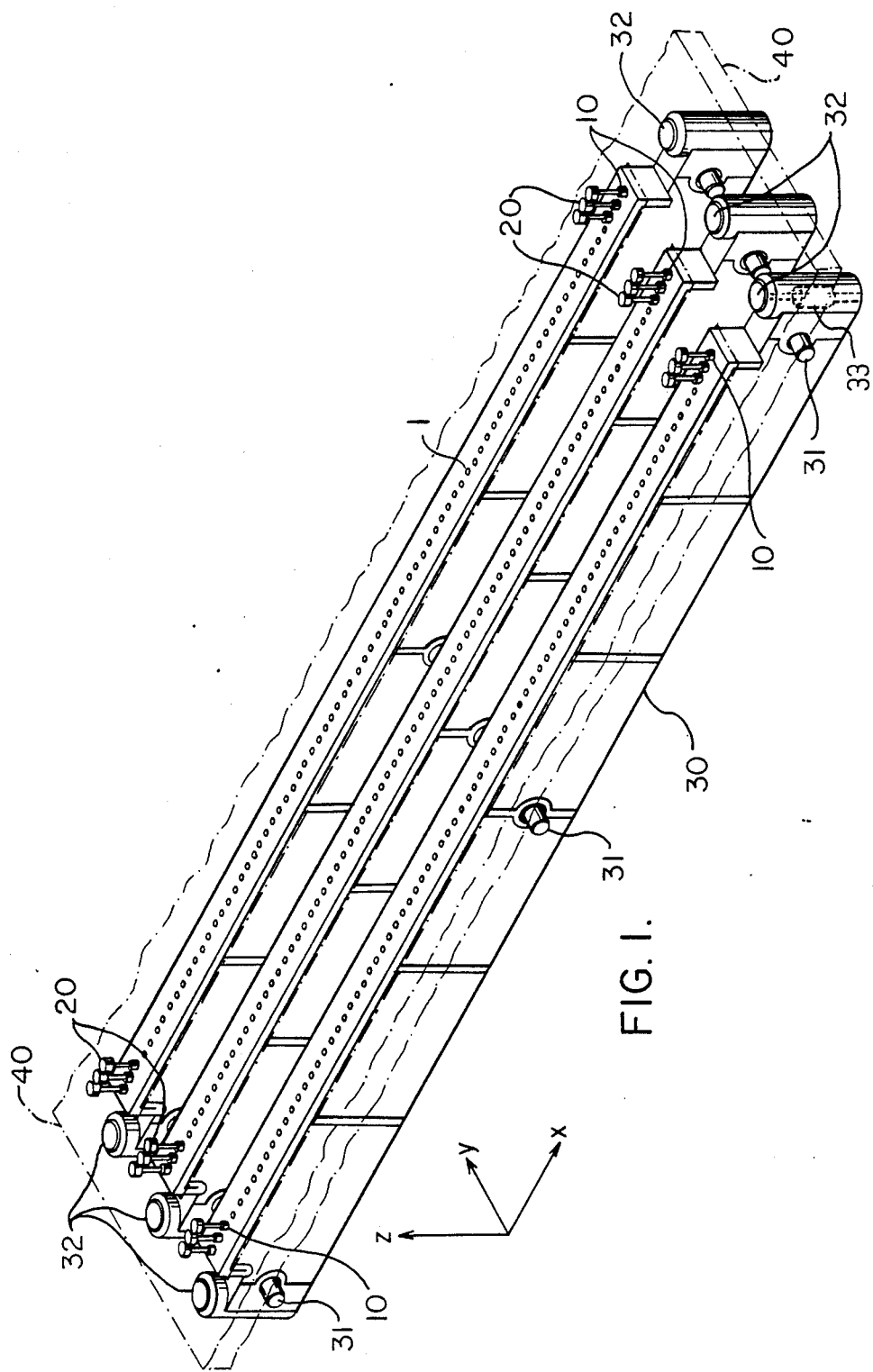
FIG. 1 illustrates the connector block of the connector system in perspective form.

It is a problem in the field of printed circuit board test facilities to efficiently interconnect the bed of nails interface to the printed-circuit-board-under-test fixture with the device scanner electronics printed circuit cards that comprise the electronic circuitry of the printed circuit board test facility. A printed circuit board test facility is a completely integrated set of resources that is used for testing analog, hybrid and digital circuits. The printed circuit board test facility typically performs shorts and open tests; analog, hybrid and digital in-circuit tests; and analog, hybrid and digital cluster and functional tests on the devices that are mounted on a printed circuit board. The test sequences executed by the printed circuit board test facility are programmed into the printed circuit board test facility by a test engineer to match the operational requirements of the printed-circuit-board-under-test. The test engineer writes a test program that causes the printed circuit board test facility to generate a sequence of stimuli in a timed relationship and apply these stimuli to the printed-circuit-board-under-test. Electrical interconnection to the printed-circuit-board-under-test is accomplished through a "bed of nails" interface that consists of a plurality of electrically conductive scanner pins in a prearranged pattern on the printed circuit board test facility. The printed-circuit-board-under-test is placed on top of this "bed of nails" and secured in place so that the printed circuit board test facility can apply the stimuli electrical signals to various devices and conductive paths on the printed-circuit-board-under-test. The printed circuit board test facility also monitors predesignated points on the printed-circuit-board-under-test via the scanner pins to detect responses to the stimuli applied to the printed-circuit-board-under-test. The timing and pattern of output signals generated by the printed-circuit-board-under-test in response to the programmed stimuli are compared with a set of known printed circuit board responses to determine whether the printed-circuit-board-under-test is operational. In the printed circuit board test facility, a printed circuit board connector system is used to provide both a mechanical and an electrical interface between the "bed of nails" scanner pins and the device scanner electronics printed circuit cards that contain the circuitry of the printed circuit board test facility. The stimuli electrical signals applied by the printed circuit board test facility to the printed-circuit-board-under-test and responses thereto pass through the printed circuit board connector system both on their way to and from the electronic components on the printed-circuit-board-under-test. Therefore, the printed circuit board connector system must maintain the signal quality of the stimuli and response electrical signals to insure that the electronic components on the printed-circuit-board-under-test are not incorrectly designated as operating properly or improperly. The length of the signal path between the scanner pins and the device scanner electronics printed circuit cards of the printed circuit board test facility must be kept as short as possible to insure signal quality. This normally dictates a vertical configuration of the device scanner electronics printed circuit cards of the printed circuit board test facility on top of which is placed the bed of nails scanner pins. The printed-circuit-board-under-test rests directly on the bed of nails scanner pins. The test fixture for a printed circuit board test facility provides an efficient and unitary electrical and mechanical interconnection between the scanner pins of the bed of nails and the device scanner electronics printed circuit cards that comprise the printed circuit board test system. The test fixture consists of a plurality of connector blocks oriented in a side by side arrangement to implement the xy coordinate axis matrix of scanner pins of the bed of nails. Each connector block consists of a custom molded plastic block that is equipped with replaceable spring loaded scanner pins. The connector block offers very high stiffness to minimize deflection under load of the spring loaded pins, very accurate dimensional stability, high impedance to electrical signals, a thermal expansion characteristic similar to the receiving plate to which it is attached and very accurate positioning. Each scanner pin is connected to a lead wire that is bent in a curved shape, for example, in the shape of a question mark. Each lead wire passes through a corresponding plated hole in the device scanner electronics printed circuit card of the printed circuit board test facility and is soldered in place. The bend in the lead wires minimizes resistance to relative motion and also minimizes mechanical stress on the soldered connection and scanner pin caused by such motion. This connector system configuration provides a number of important characteristics: short electrical path from the scanner pins to the electronics on the device scanner electronics printed circuit cards; very accurate three axis location of each scanner pin with respect to a single fixed point in space; significant single axis compliance between the scanner pin and the device scanner electronics printed circuit cards to allow for scanner pin positioning when the device scanner electronics printed circuit card is fixed in that axis.

Connector System Architecture

The connector system for a printed circuit board test facility consists of a plurality of connector blocks 30 each of which is placed in juxtaposed position to an adjacent connector block 30 as shown in FIG. 1. The scanner pins 20 protruding from the top side of each connector block 30 extend through a corresponding rectangular-shaped aperture in receiving plate 40 to form an xy coordinate axis matrix that comprise the scanner pins of the printed circuit board test facility. (An x, y and z coordinate axis is drawn on FIG. 1 to illustrate the orientation of the various elements of the test fixture.) The rectangular-shaped aperture in receiving plate 40 can be a single large aperture for a number of connector blocks 30 or can be a plurality of apertures, one per connector block 30. Connected to each connector block 30 is an associated device scanner electronics printed circuit card 60 (FIGS. 2 and 3) that extends in a downward direction in the z axis direction. Printed circuit card 60 is coplanar with the x-z coordinate axis plane. Connector block 30 forms an integral, unitary, mechanical and electrical interface between scanner pins 20 and printed circuit card 60. The mechanical interface formed between connector block 30 and printed circuit card 60 must automatically compensate for alignment variations in all three coordinate directions. Printed circuit card 60 is secured in the printed circuit board test facility and may not precisely align with adjacent printed circuit cards. Any such misalignment is reflected in the loss of positional accuracy of the associated scanner pins 20 in the matrix of scanner pins. Thus, connector block 30 must offset any positional misalignment between adjacent printed circuit cards 60 to automatically align scanner pins with respect to a reference point in the x, y and z coordinate directions.

Each one of the connector blocks 30 consists of a custom molded piece of plastic that has a plurality of holes 1 molded through the z axis in the top surface thereof. These holes 1 are arranged in a precisely spaced orientation along the x axis in a straight line from one end of connector block 30 to the other end. Connector block 30 is manufactured from a type of plastic known generically as polyphenylene sulfide resin (commercially available and well known as Phillips Ryton R4 Resin) which is custom molded into the cross sectionally T-shaped beam illustrated in FIG. 1. This type of plastic is easily molded and has a very high impedance to electrical signals. This plastic also provides very high stiffness to minimize deflection of connector block 30 in the z direction under the load of the spring loaded scanner pins 20. The connector block 30 also has very accurate dimensional stability in the x and y directions to maintain the precise orientation in the x and y directions of the plurality of scanner pins 20 illustrated in FIG. 1. Each of the scanner pins 20 is a commercially available spring loaded contact known as a "pogo pin". Each of the spring loaded scanner pins 20 is loaded into the corresponding scanner pin socket 10 that is press fit into the corresponding hole 1 in the top side of connector block 30. Each connector block 30 is also equipped with a pair of aligning bosses 32, one at either end of the connector block for x and y axes alignment and for z axis referencing. Each aligning boss 32 has a threaded insert 33. The aligning bosses 32 are used to connect connector block 30 to an associated receiving plate 40. Connector block 30 is also equipped with a plurality of printed circuit card attachment bosses 31 that are used to secure connector block 30 to the printed circuit board 60 as is described below.

Connector Block Cross Section

FIG. 2 illustrates a cross sectional view of connector block 30 showing the orientation of scanner pin 20, scanner pin socket 10, printed circuit card attachment boss 31 and a number of other elements. Element 60 on FIG. 2 is the device scanner electronics printed circuit card that contains the electronic devices that comprise the signal generation timing and detection circuitry of the printed circuit board test facility. Printed circuit card 60 includes a plurality of slotted holes 61, each of which is adapted to receive a corresponding one of the printed circuit board attachment bosses 31. The slotted holes are elongated in the x direction while providing a tight tolerance for the printed circuit board attachment bosses 31 in the z direction. This allows relative motion between connector block 30 and the printed circuit card 60 in the x direction but restrains motion in the z axis direction. The use of slotted attachment holes 61 automatically compensates for any variation in the alignment of printed circuit card 60 with respect to the orientation of connector block 30. Any movement in the y axis direction is prevented by the use of push-on retaining rings 70 which hold connector block 30 fixedly attached to printed circuit card 60. While the above described slotted attachment holes 61 provide for the physical interconnection of connector block 30 and printed circuit card 60 and the misalignment therebetween, the electrical interconnection between these two elements is accomplished by the use of a flexible lead wire 11 which includes a bend 12 in the shape of a question mark therein. A plated hole 62 is provided in printed circuit card 60 for each one of lead wires 11. The end of lead wire 11 is placed through corresponding plated hole 62 where it is soldered by the application of solder 63 to provide electrical interconnection between lead wire 11 and a conductive path (not shown) on the surface of printed circuit card 60. The use of a bend 12 minimizes mechanical resistance to the relative motion of connector block 30 with respect to printed circuit card 60 and also minimizes the stress in lead wire 11 and on soldered connection 63 that is caused by this relative motion. In addition, the diameter of lead wire is smaller than the diameter of the corresponding hole 1 provided in connector block 30 for the spring loaded scanner pin 20 and its corresponding scanner pin socket 10. This electrical interconnection provides a very short electrical path between scanner pin 20 and printed circuit card 60 with a minimum of interconnections. This electrical path exhibits low resistance and minimum variation to reduce the degradation of the signals carried on this electrical path.

Scanner pin socket 10 is a self centering socket that is press fit into the corresponding hole 1 provided in connector block 30. Precise z axis positioning of scanner pin socket 10 is provided by the use of a shoulder 21 located proximate to one end of scanner pin socket 10. In the assembly process, scanner pin socket 10 is press fit into the corresponding hole 1 until shoulder 21 comes into contact with the top surface of connector block 30, thereby precisely determining the z axis position of scanner pin socket 10. In this fashion, precise positioning of the scanner pin socket 10 is obtained with reference to the top surface of connector block 30. The scanner pins 20 are spring loaded and press fit into scanner pin socket 10. The scanner pins 20 are replaceable for maintenance purposes.

Connector Block Side View

FIG. 3 illustrates a side view of connector block 30 illustrating the attachment of connector block 30 to receiving plate 40. Receiving plate 40 has chamfered holes 41 at either end thereof with very well controlled tolerances in regard to a fixed point in space defined on the top surface of receiving plate 40. Chamfered hole 41 has a small diameter portion which is tapped to receive connector retainer screws 50. The connector retaining screw 50 has an external thread at its tip but necks down to a diameter which clears the threaded hole. Thus, retaining screws 50 are free to move in the z axis between the limits of the threaded tip and the head which eliminates interference between the receiving plate alignment bosses 32 and the retaining screws 50. The retaining screw 50 is retained in receiving plate 40 at all times in the assembly process.

The printed circuit card 60 with its attached connector block 30 is positioned below the corresponding chamfered holes 41 such that alignment bosses 32 at either end of connector block 30 are positioned approximately under the center of the corresponding chamfered holes 41 in receiving plate 40. Retaining screws 50 loosely fit in their threaded holes 42 since the retaining screws 50 have a necked down portion. Therefore, the threaded end of each of the retaining screws 50 can be captured inside alignment bosses 32. As connector block 30 is drawn up by hand to come in contact with receiving plate 40, the top of each of the alignment bosses of connector block 30 comes into contact with the edges of chamfered holes 41 of receiving plate 40. As the angled tips of the alignment bosses 32 of connector block 30 engage the wide chamfer of the alignment holes 41, the angles of the chamfers on the alignment bosses 32 and alignment holes 41 force connector block 30 to move in the x and y directions thereby positioning connector block 30 with respect to receiving plate 40. The alignment continues until connector block 30 is fully seated against receiving plate 40. Thus, the angles on the alignment bosses 32 and the wide chamfer 41 provide the x and y positioning of the connector block 30 with respect to receiving plate 40 while alignment bosses 32 when held tightly by engaging the threads of retaining screws 50 in threaded inserts 33 in alignment bosses 32 provide the z axis positioning of connector block 30. Once installed as described above, connector block 30 is accurately positioned in the x, y and z directions by use of the alignment bosses 32 at either end of connector block 30. As was mentioned above, the materials used to fabricate connector block 30 have approximately the same coefficient of thermal expansion as does receiving plate 40, even though receiving plate 40 is typically manufactured from a material such as aluminum. Thus, connector block 30 has dimensional stability in the x direction due to the matching of the thermal expansion rate. Dimensional stability in the y direction is provided by the use of the beam type of architecture for connector 30, illustrated in FIG. 1. This beam type of configuration also provides dimensional stability in the z direction since the material used and the details of this design provide very high stiffness to minimize deflection on the load provided by the spring loaded scanner pins 20 as they are placed in contact with the printed-circuit-board-under-test.

Connector System Characteristics

Thus, the connector system for a printed circuit board test facility satisfies the following primary requirements: short electrical path from each scanner pin to the test system device scanner electronics printed circuit cards; very accurate three axis location of each scanner pin with respect to a single fixed point in space; significant single axis compliance between the scanner pins and the associated device scanner electronics printed circuit card to allow for scanner pin positioning when the device scanner electronics printed circuit card is fixed in that axis. There are a number of secondary requirements that are also met by this test fixture. The secondary requirements are: minimized electrical resistance from each scanner pin to the device scanner electronics printed circuit card; easily replaced scanner pins; highly stable connection path with regard to motion, temperature, humidity; high impedance to electrical signals between adjacent scanner pins; rigidly secure device scanner electronics printed circuit card in shock and vibratory environments. The test fixture for a printed circuit board test system as described above satisfies all of these primary and secondary requirements thereby providing an efficient and relatively inexpensive test fixture to implement the bed of nails required for a printed circuit board test system.

While a specific embodiment of this invention has been disclosed it is expected that those skilled in the art can design alternate embodiments that fall within the scope of the appended claims.

I claim:

1. Apparatus for a printed circuit board test facility to implement a matrix of scanner pins that interface said printed circuit board test facility to a printed circuit board under test, comprising:
   receiving plate having a plurality of identical apertures cut in the face thereof and having cylindrical alignment holes at opposite ends of each of said apertures;
   a like plurality of connector blocks connectable to said receiving plate at a corresponding one of said apertures, each of said connector blocks comprising:
      a number of scanner pins inserted into a first surface of said connector block, where said first surface is juxtaposed with said aperture such that said scanner pins protrude through said aperture in said receiving plate,
      a like number of lead wires, each electrically connected to a corresponding one of said scanner pins at a first end and at a second end to a contact point on a printed circuit card associated with said connector block,
      cylindrical, chamfered alignment bosses positionally oriented to match said cylindrical alignment holes in said receiving plate for precisely orienting and securing said connector block to said receiving plate.

2. The apparatus of claim 1 wherein each of said plurality of said receiving plate apertures are rectangular shaped.

3. The apparatus of claim 2 wherein said cylindrical alignment holes are positioned at opposite ends of the long dimension of said rectangular shaped apertures.

4. The apparatus of claim 1 wherein said cylindrical alignment holes are chamfered holes to automatically compensate for positional misalignment between said cylindrical alignment holes and said corresponding cylindrical, chamfered alignment bosses of said connector block.

5. The apparatus of claim 4 wherein said cylindrical, chamfered alignment bosses are chamfered in like sense to said corresponding cylindrical alignment holes to automatically compensate for positional misalignment between said cylindrical, chamfered alignment bosses and said corresponding cylindrical alignment holes in said receiving plate.

6. The apparatus of claim 1 wherein said lead wires each include:
   a curved bend between said first and said second ends for automatically compensating for positional misalignment between said connector block and said associated printed circuit card.

7. The apparatus of claim 1 wherein said connector block includes:
   a beam shaped block of plastic material having a wide cross section dimension along its length and a narrow cross section dimension along its length;
   a number of holes in said block along said narrow dimension, each of said holes of size and shape to receive a corresponding one of said scanner pins.

8. The apparatus of claim 7 wherein said cylindrical, chamfered alignment bosses are positioned at opposite ends of said block on said narrow dimension.

9. The apparatus of claim 7 wherein said block is in the shape of a T-shaped beam.

10. The apparatus of claim 1 wherein said connector block further includes:
    two or more printed circuit attachment bosses for securing said connector block to said associated printed circuit card.

11. The apparatus of claim 10 wherein said associated printed circuit card includes two or more slotted holes positioned to match said attachment bosses for automatically compensating for positional misalignment between said printed circuit board and said associated connector block.

12. The apparatus of claim 1 wherein each of said cylindrical, chamfered alignment bosses include a threaded insert in the center thereof for securing said connector block to said receiving plate via a screw inserted into said corresponding cylindrical alignment hole and threaded into said threaded insert.

13. The apparatus of claim 1 wherein said connector block is manufactured from a material having thermal dimensional stability substantially equal to that of said receiving plate.

14. The apparatus of claim 7 wherein said block of plastic material is molded from a material known as Phillips Ryton R4 resin.

15. Apparatus for a printed circuit board test facility to implement a matrix of scanner pins that interface said printed circuit board test facility to a printed circuit board under test, comprising:
    receiving plate having a plurality of identical rectangular shaped apertures cut in the face thereof and having cylindrical alignment holes at opposite ends of the long dimension of each of said apertures;
    a like plurality of connector blocks connectable to said receiving plate at a corresponding one of said apertures, each of said connector blocks comprising:
        a beam shaped block of plastic material,
        a number of scanner pins inserted into a first surface of said connector block, where said first surface is juxtaposed with said aperture such that said scanner pins protrude through said aperture in said receiving plate,
        a like number of lead wires, each electrically connected to a corresponding one of said scanner pins at a first end and to a contact point on a printed circuit board associated with said connector block,
        cylindrical, chamfered alignment bosses positionally oriented to match said cylindrical alignment holes in said receiving plate for precisely orienting and securing said connector block to said receiving plate.

16. Apparatus for a printed circuit board test facility to implement a test bed of scanner pins that interface two or more device scanner electronics printed circuit cards in said printed circuit board test facility to a printed circuit board under test, comprising:
    receiving plate having one or more apertures cut in the face thereof and having cylindrical alignment holes at opposite ends of each of said apertures;
    two or more connector blocks connectable to said receiving plate at said apertures, each of said connector blocks comprising:
        a number of scanner pins inserted into a first surface of said connector block, where said first surface is juxtaposed with said aperture such that said scanner pins protrude through said aperture in said receiving plate,
        a like number of lead wires, each electrically connected to a corresponding one of said scanner pins at a first end and at a second end to a contact point on one of said printed circuit cards associated with said connector block,
        cylindrical, chamfered alignment bosses positionally oriented to match said cylindrical alignment holes in said receiving plate for precisely orienting and securing said connector block to said receiving plate.

17. The apparatus of claim 16 wherein each of said receiving plate apertures are rectangular shaped.

18. The apparatus of claim 17 wherein said cylindrical alignment holes are positioned at opposite ends of one dimension of said rectangular shaped apertures.

19. The apparatus of claim 16 wherein said cylindrical alignment holes are chamfered holes to automatically compensate for positional misalignment between said cylindrical alignment holes and said corresponding cylindrical, chamfered alignment bosses of said connector block.

20. The apparatus of claim 19 wherein said cylindrical, chamfered alignment bosses are chamfered in like sense to said corresponding cylindrical alignment holes to automatically compensate for positional misalignment between said cylindrical, chamfered alignment bosses and said corresponding cylindrical alignment holes in said receiving plate.

21. The apparatus of claim 16 wherein said lead wires each include:
    a curved bend between said first and said second ends for automatically compensating for positional misalignment between said connector block and said associated printed circuit card.

22. The apparatus of claim 16 wherein said connector block includes:
    a beam shaped block of plastic material having a wide cross section dimension along its length and a narrow cross section dimension along its length said narrow dimension comprising said first surface;
a number of holes in said block along said narrow dimension, each of said holes of size and shape to receive a corresponding one of said scanner pins.

23. The apparatus of claim 22 wherein said cylindrical, chamfered alignment bosses are positioned at opposite ends of said block protruding from said first surface of said block.

24. The apparatus of claim 22 wherein said block is a beam having a T-shaped cross section.

25. The apparatus of claim 16 wherein said connector block further includes:
two or more printed circuit attachment bosses protruding from the surface of said block in said wide dimension for securing said connector block to said associated printed circuit card.

26. The apparatus of claim 25 wherein said associated printed circuit card includes two or more slotted holes positioned to match said attachment bosses for automatically compensating for positional misalignment between said printed circuit card and said associated connector block.

27. The apparatus of claim 16 wherein each of said cylindrical, chamfered alignment bosses include a threaded insert in the center thereof for securing said connector block to said receiving plate via a screw inserted into said corresponding cylindrical alignment hole and threaded into said threaded insert.

28. The apparatus of claim 16 wherein said connector block is manufactured from a material having thermal dimensional stability substantially equal to that of said receiving plate.

29. The apparatus of claim 22 wherein said block of plastic material is molded from a material known as Phillips Ryton R4 resin.

30. Apparatus for a printed circuit board test facility to implement a matrix of scanner pins that interface said printed circuit board test facility to a printed-circuit-board-under-test fixture, comprising:
receiving plate having a rectangular aperture in the face thereof and having cylindrical alignment holes at opposite ends of said aperture;
a plurality of connector blocks connectable to said receiving plate at said aperture, each of said connector blocks comprising:
a number of scanner pins inserted into a first surface of said connector block, where said first surface is juxtaposed with said aperture such that said scanner pins protrude through said aperture in said receiving plate,
a like number of lead wires, each electrically connected to a corresponding one of said scanner pins at a first end and at a second end to a contact point on a printed circuit card associated with said connected block,
cylindrical, chamfered alignment bosses positionally oriented to match said cylindrical alignment holes in said receiving plate for precisely orienting and securing said connector block to said receiving plate.

31. The apparatus of claim 1 wherein each of said scanner pins is encased in a socket and said socket is inserted into said first surface of said connector block.

32. The apparatus of claim 30 wherein each of said scanner pins is encased in a socket and said socket is inserted into said first surface of said connector block.

* * * * *

UNITED STATES PATENT AND TRADEMARK OFFICE
CERTIFICATE OF CORRECTION

PATENT NO. : 4,939,454

DATED : July 3, 1990

INVENTOR(S) : William R. Miner

It is certified that error appears in the above-identified patent and that said Letters Patent is hereby corrected as shown below:

In the Abstract:

Line 4 "elecronics" should read --electronics--

Column 2, Line 14 "t a" should read --to a--

Signed and Sealed this

Eleventh Day of February, 1992

Attest:

HARRY F. MANBECK, JR.

*Attesting Officer*     *Commissioner of Patents and Trademarks*